United States Patent
Yeo et al.

(10) Patent No.: US 6,292,060 B1
(45) Date of Patent: Sep. 18, 2001

(54) TECHNIQUE TO GENERATE NEGATIVE CONDUCTANCE IN CMOS TUNED CASCODE RF AMPLIFIERS

(75) Inventors: Kiat-Seng Yeo; Kok Lim Chan; Manh Anh Do; Jian Guo Ma; Johnny Kok Wai Chew, all of Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 09/395,288

(22) Filed: Sep. 13, 1999

(51) Int. Cl.$^7$ ................................................. H03F 3/191
(52) U.S. Cl. ................................. 330/302; 330/305
(58) Field of Search .................................... 330/302, 305, 330/306, 310, 311; 333/213

(56) References Cited

U.S. PATENT DOCUMENTS

| | | | |
|---|---|---|---|
| 3,805,164 | * 4/1974 | Callaway | 330/306 |
| 4,409,557 | * 10/1983 | Sechi | 330/305 |
| 4,663,599 | 5/1987 | Patch | 330/311 |
| 5,142,239 | * 8/1992 | Brayton et al. | 330/276 |
| 5,488,382 | 1/1996 | Fenzi et al. | 343/700 R |
| 5,574,405 | 11/1996 | Razavi | 331/2 |
| 5,642,080 | 6/1997 | Whang et al. | 330/277 |
| 5,710,523 | 1/1998 | Kobayashi | 330/293 |
| 5,861,778 | 1/1999 | Louagie et al. | 330/260 |
| 6,127,886 | * 10/2000 | Khabbaz et al. | 330/302 |

* cited by examiner

Primary Examiner—Robert Pascal
Assistant Examiner—Khanh Van Nguyen
(74) Attorney, Agent, or Firm—George O. Saile; Rosemary L. S. Pike

(57) ABSTRACT

In this invention a single additional capacitor is added to a tuned cascode LNA which boosts the circuit Q and the gain of the amplifier. The added capacitor creates a negative real part of the impedance which when combined with the impedance of the LC tank circuit improves both the Q and the gain of the amplifier. The capacitor does not dissipate any power, and being a passive device the capacitor does not add additional noise to the circuit. With an improved gain there is a much improved signal to noise ratio. The higher Q allows the amplifier to provide some additional bandpass and reduce image reduction requirements in subsequent amplifier stages.

7 Claims, 3 Drawing Sheets

TECHNIQUE TO GENERATE NEGATIVE CONDUCTANCE IN CMOS TUNED CASCODE RF AMPLIFIERS

BACKGROUND OF THE INVENTION

1. Field of Invention

This invention relates to printed and integrated circuits and in particular to integrated CMOS tuned RF amplifiers.

2. Description of Related Art

Advances in CMOS technology has made it possible to integrate onto a single chip a communication system operating in a frequency range between 0.9 and 2.5 GHz which can be used in mobile phones and global positioning systems. An important aspect of the communication system is having a low noise amplifier (LNA). The prime objective of the LNA is to produce a signal at a given noise figure for a minimum expenditure of power. Since an LNA is a first stage of a receiver, the overall design will be dominated by the noise figure. When the gain of the LNA is large, noise contribution by subsequent stages becomes insignificant. Also a narrow bandwidth LNA provides increased immunity for low frequency base band signals.

In U.S. Pat. No. 5,861,778 (Louagie et al.) a low noise amplifier is based on a differential difference amplifier having a differential output with two pairs of differential inputs. This is done to minimize harmonic distortion. In U.S. Pat. No. 5,710,523 (Kobayashi) a low noise amplifier utilizing a high mobility transistor and a tunable heterojunction bipolar transistor is described. In U.S. Pat. No. 5,642,080 (Whang et al.) a low noise amplifier is described that includes an input impedance component consisting of an inductor and a capacitor. Two MESFETs are connected in cascade with a capacitor connected between them to enhance the stability of the amplifier. In U.S. Pat. No. 5,574,405 (Razavi) a low noise amplifier is combined with a mixer and synthesizer circuit to produce an RF system front end. The synthesizer shares power with the low noise amplifier to reduce power consumption. In U.S. Pat. No. 5,488,382 (Fenzi et al.) a low noise amplifier with high input impedance is described using a cascode pair of FET transistors. A feedback is provided from output to input to lower the Q of the antenna at the input of the amplifier, broadening the bandwidth of the detector and matching the antenna to the noise factor of the amplifier.

A common source tuned RF amplifier is frequently used as a low noise amplifier. Using a cascode amplifier as an input stage isolates an inter stage tank circuit from any input matching networks which can improve stability. An integrated inductor which forms a part of the tank circuit has a low Q (quality factor) which limits the Q of the LNA amplifier. The gain and Q of the LNA can be enhanced by adding a negative conductance at the output of the LNA to the tank circuit, but this usually means added active devices which results in more noise and more power dissipation.

SUMMARY OF THE INVENTION

In this invention a single capacitor is added to a cascode low noise amplifier to produce a negative conductance and increase the Q and gain, as well as improve the noise performance of the amplifier. An LC tank circuit is connected to the drain of the output transistor of the cascode amplifier, and the added capacitor is connected from drain of the output transistor to the drain of the input transistor. The capacitor between the two drains produces a negative conductance which when combined with the LC tank circuit produces a higher amplifier Q and gain. The added capacitor being passive does not generate noise or add additional power to the amplifier, and enhances the characteristics of the low noise amplifier by providing better gain without additional power consumption. The higher Q allows the low noise amplifier to perform some bandpass functions.

The LC network connected to the drain of the output transistor of the LNA (low noise amplifier) is designed to produce a peak gain at the center frequency of the amplifier. The added capacitor connected between the drains of the cascode transistors of the LNA is chosen to produce a maximum gain. The value of the added capacitor creates a negative conductance which when combined with the LC tank circuit increases the Q and gain of the LNA and shifts the center frequency of the amplifier. The capacitor of the LC tank circuit is adjusted to return the center frequency to the required design point producing a high Q and gain for the LNA.

The techniques of this invention are applicable in tuned RF amplifiers developed from a wide range devices and technologies. Devices such as BJT, MESFET, HBT and HEMT can be used to form tuned RF amplifiers using similar tuning techniques disclosed in this invention. These devices can be constructed using various processes and technologies such as CMOS, BJT, BiCMOS, SIGe and SOI.

BRIEF DESCRIPTION OF THE DRAWINGS

This invention will be described with reference to the accompanying drawings, wherein.

DETAILED DESCRIPTION OF THE PREFERRED EMBODIMENT

Figure 1:
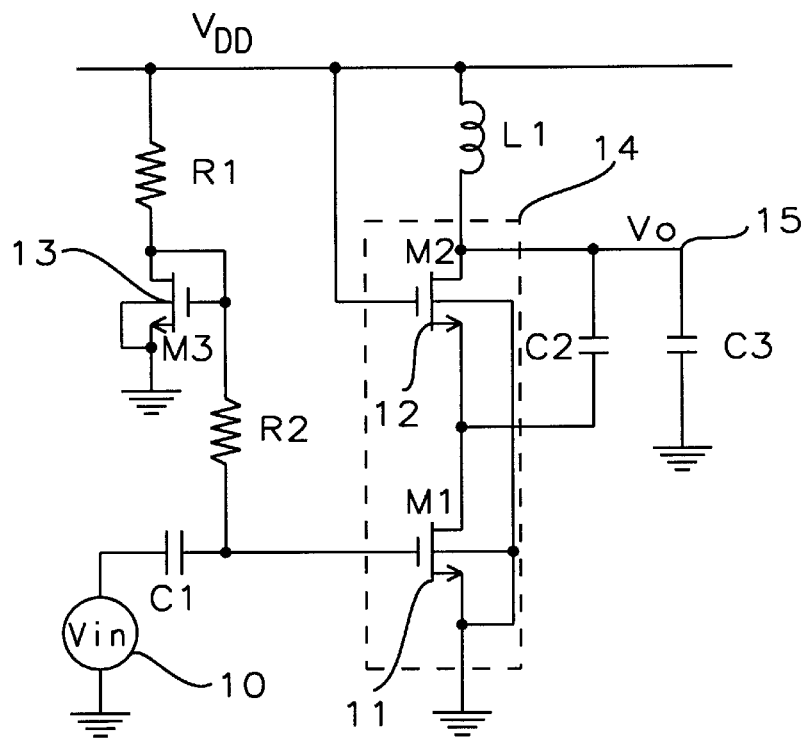
FIG. 1 is a schematic diagram of the LNA of this invention.

In FIG. 1 is shown a schematic diagram of the LNA of this invention. An input signal 10 is connected through an input capacitor C1 to the gate of transistor 11 designated as M1 which forms a cascode amplifier 14 with transistor 12 designated as M2. A bias network comprising transistor 13 M3 and resistors R1 and R2 is connected to the gate of transistor M1 to provide an appropriate bias for the cascode amplifier 14. An LC tank circuit is formed between inductor L1 and capacitor C3 which is connected to the drain of transistor M2 of the cascode amplifier 14. The drain of the transistor M2 provides the output 15 of the LNA. A capacitor C2 is added between the drains of transistors M1 and M2 of the cascode amplifier. This added capacitor produces a negative conductance at the drain of transistor M2 which when combined with the LC tank circuit produces a higher gain and higher overall circuit Q.

Figure 2:
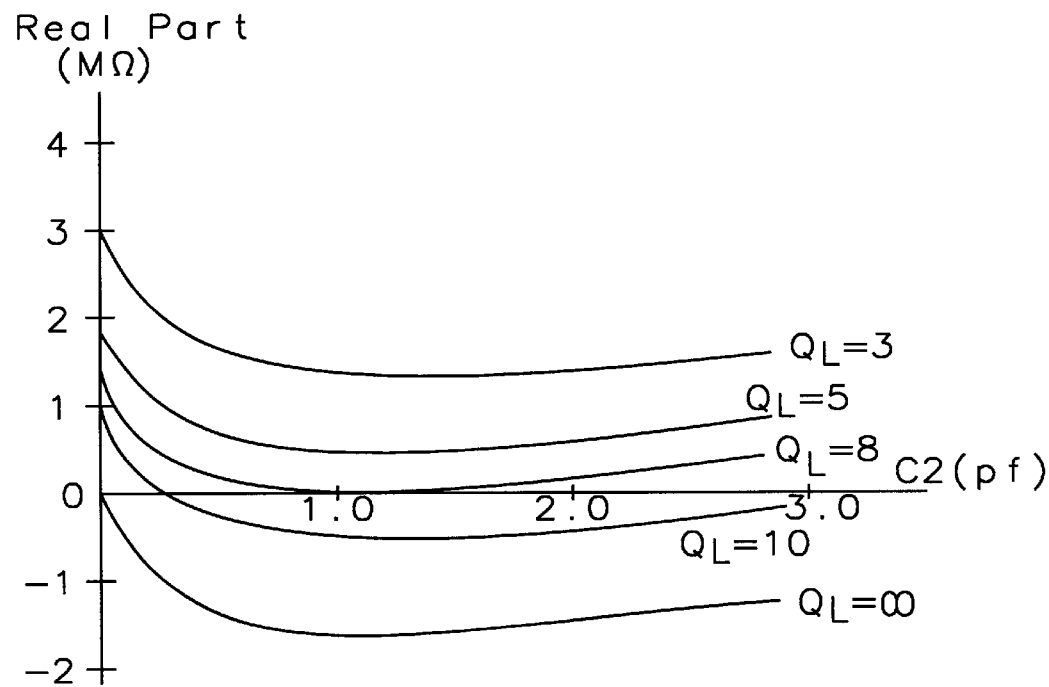
FIG. 2 is a set of curves that shows the effect of inductor Q and added capacitance between stages of a cascode amplifier on the total output conductance of the amplifier.

In FIG. 2 is shown a set of curves relating the value of the inductor L1 quality factor $Q_L$ to the capacitance of the added capacitor C2 for various values of the real part of the output impedance of the LNA. A relatively low valued of the inductor $Q_L$ is required to maintain circuit stability by providing a positive real part of the circuit output impedance to allow stable operation. As an example, a 1.8 GHz tuned cascode amplifier can be designed using an integrated inductor of L=9 nH and a $Q_L$=5 with C3=0.7 pF. As shown in FIG. 2 the added capacitance of C2 can be any value and still produce a stable operation. For values of $Q_L$>5 the range of values for C2 become more restricted for stable operations.

Figure 3:
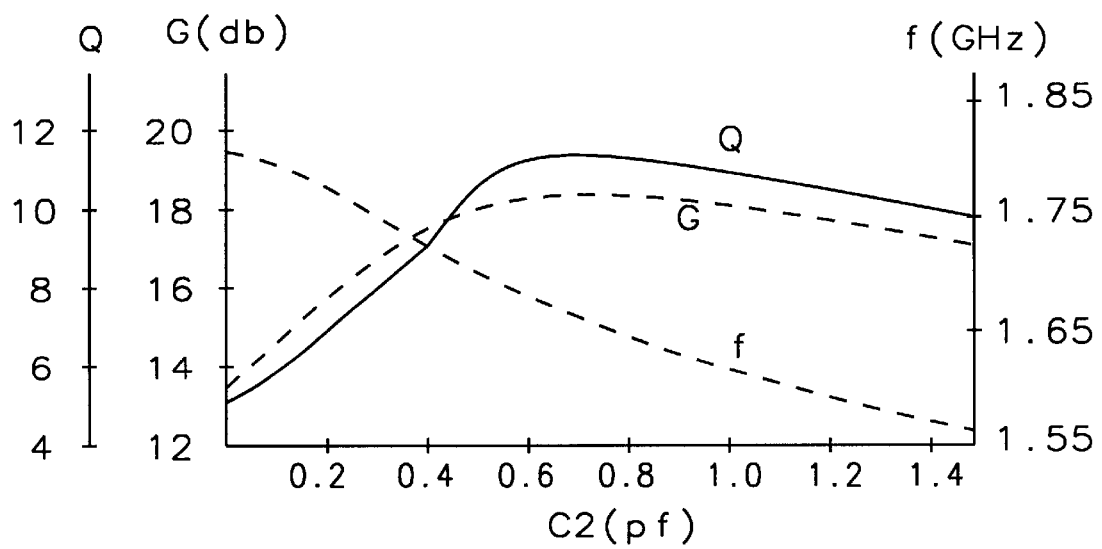
FIG. 3 is a set of curves showing amplifier Q, gain and frequency versus the added capacitance between cascode stages of the LNA.

In FIG. 3 is shown the effects of capacitor C2 on overall circuit Q, amplifier gain G and center frequency of the amplifier. A maximum gain G and circuit Q is obtained for capacitance of approximately about 0.8 pF for capacitor C2 when $Q_L$=5. The frequency of the amplifier which produces maximum gain and Q has shifted below the 1.8 GHz design point. The frequency shift can be corrected by reducing the capacitance of capacitor C3 from approximately about 0.7 pf to approximately about 0.51 pf.

Figure 4:
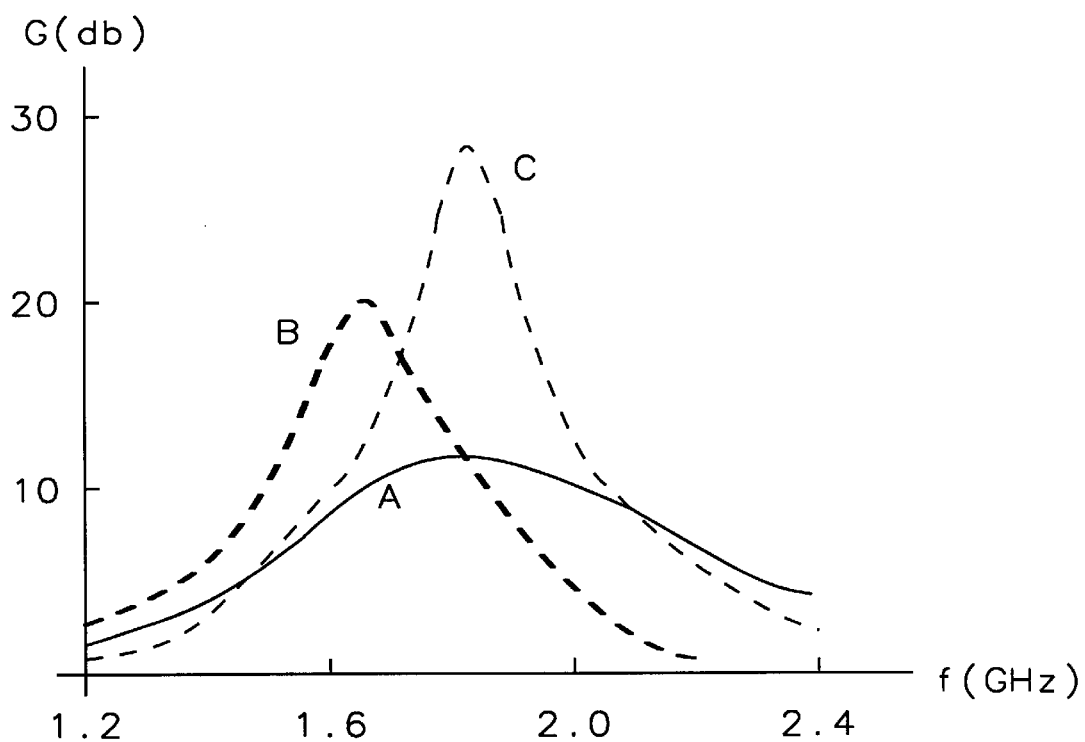
FIG. 4 shows the effect of adjusting capacitance on gain of the LNA.

FIG. 4 shows examples of the gain effects for various values of C2, C3 and L1. Curve A has a center frequency of approximately 1.8 GHz for L1=9 nH and C3=0.7 pF. Adding capacitor C2=0.8 pF connected between the drains of the cascode amplifier 14 produces curve B which is shifted in frequency, has a higher peak gain and a narrower bandwidth Curve C shows the effects of compensating for the frequency shift of curve B by reducing C3 from approximately about 0.7 pf to approximately about 0.51 pf. Curve C has a higher gain and circuit Q than either curves A or B and has a center frequency of approximately 1.8 GHz which is the design point for the amplifier.

Figure 5:
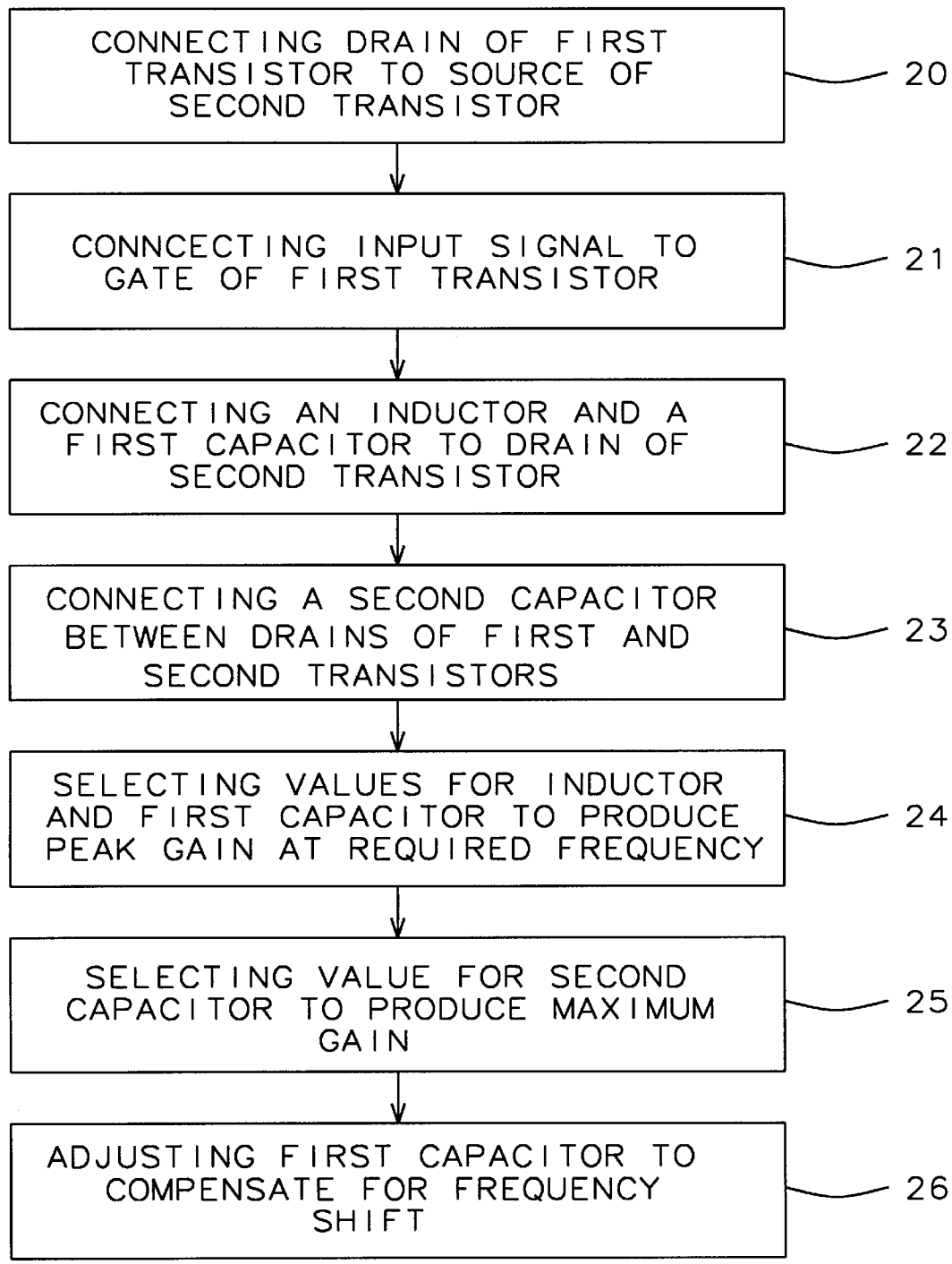
FIG. 5 shows a method of creating an LNA with high Q and high gain.

In FIG. 5 is shown a method for optimizing the gain and circuit Q for a cascode LNA. A drain of a first transistor is connected the source of a second transistor of a cascode amplifier 20. An input signal is connected to the gate of the first transistor of the cascode amplifier 21. An inductor and a capacitor are connected to the drain of the second transistor of the cascode amplifier 22. The drain of the second transistor is the output for the cascode amplifier. A second capacitor is connected between the drains of the first and second transistor of the cascode amplifier 23. Values for the inductor and the first capacitor are selected to produce a peak gain at a required frequency 24. The Q of the inductor is held at a value that maintains circuit stability. A value is selected for the second capacitor connected between drains of the transistors of the cascode amplifier to produce a maximum gain 25. A frequency shift occurs as a result of the capacitance of the second capacitor. This frequency shift is compensated for by adjusting the first capacitor to be a lower value 26. The result of this method produces a low noise amplifier with a high gain and circuit Q at a required frequency.

While the invention has been particularly shown and described with reference to preferred embodiments thereof, it will be understood by those skilled in the art that various changes in form and details may be made without departing from the spirit and scope of the invention.

What is claimed is:

1. A tuned cascode amplifier, comprising:
   a) a first transistor connected in cascode with a second transistor in a radio frequency (RF) amplifier,
   b) an input to said amplifier connected to gate of said first transistor,
   c) an output of said amplifier connected from drain of said second transistor
   d) an inductor-capacitor (LC) network connected to drain of said second transistor,
   e) said LC network comprising an integrated inductor and a first capacitor,
   f) a second capacitor connected between said LC network and drain of said first transistor to enhance said LC network quality factor (Q) which results in an increased gain of said amplifier,
   g) said second capacitor limited to values that produce a stable amplifier.

2. The amplifier of claim 1, wherein increasing capacitance of said second capacitor reduces frequency of peak gain of said RF amplifier.

3. The amplifier of claim 2, wherein decreasing, or increasing, capacitance of said first capacitor compensates for frequency effects of said second capacitor which further increases circuit Q and frequency of peak gain of said RF amplifier.

4. A method of forming a tuned cascode radio frequency (RI;) amplifier, comprising:
   a) connecting a drain of a first transistor to a source of a second transistor to form a cascode amplifier,
   b) connecting an input signal to gate of said first transistor,
   c) connecting an inductor and a first capacitor to form an LC network at output of said amplifier connected to drain of said second transistor,
   d) connecting a second capacitor between the drain of said second transistor and drain of said first transistor,
   e) selecting values for said inductor and said first capacitor to produce a peak gain at a required frequency,
   f) selecting a value for said second capacitor to produce a maximum gain,
   g) adjusting said first capacitor to compensate for frequency shift caused by said second capacitor and produce a tuned amplifier at said required frequency.

5. The method of claim 4, wherein selecting a value for said second capacitor produces a negative conductance that enhances the quality factor (Q) and gain of the tuned cascode amplifier.

6. The method of claim 4, wherein said inductor is an integrated inductor.

7. The method of claim 4, wherein a Q for said inductor is limited to produce a positive real part of amplifier output impedance and provide a stable circuit operation.

* * * * *